(12) United States Patent  
Akaogi et al.

(10) Patent No.: US 8,923,083 B2  
(45) Date of Patent: Dec. 30, 2014

(54) METHOD OF IDENTIFYING DAMAGED BITLINE ADDRESS IN NON-VOLATILE

(75) Inventors: Takao Akaogi, Cupertino, CA (US); Tony Chan, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 190 days.

(21) Appl. No.: 13/592,437

(22) Filed: Aug. 23, 2012

(65) Prior Publication Data

US 2014/0056088 A1    Feb. 27, 2014

(51) Int. Cl.  
*G11C 29/00* (2006.01)

(52) U.S. Cl.  
USPC ..................... 365/201; 365/189.05

(58) Field of Classification Search  
CPC ........ G11C 29/00; G11C 29/04; G11C 29/70; G11C 29/76  
USPC .................. 365/201, 189.05, 49.11  
See application file for complete search history.

(56) References Cited

U.S. PATENT DOCUMENTS

| 6,407,953 B1 * | 6/2002 | Cleeves | 365/201 |
| 8,159,892 B2 * | 4/2012 | Kang | 365/201 |
| 2003/0035322 A1 * | 2/2003 | Wong | 365/185.33 |
| 2003/0133340 A1 * | 7/2003 | Lee | 365/200 |
| 2006/0164890 A1 * | 7/2006 | Lee | 365/185.28 |
| 2008/0174297 A1 * | 7/2008 | Jang | 324/76.11 |
| 2010/0302866 A1 * | 12/2010 | Cha et al. | 365/185.25 |
| 2011/0249480 A1 * | 10/2011 | Cho | 365/49.1 |

* cited by examiner

*Primary Examiner* — Douglas King  
(74) *Attorney, Agent, or Firm* — Schmeiser, Olsen & Watts, LLP

(57) ABSTRACT

A method of identifying a damaged bitline address in a non-volatile memory device is introduced. The non-volatile memory device includes a memory cell array and a plurality of bit lines crossing the memory cell array. Each bit line has a first end and a second end. The bit lines are divided into a first group and a second group. The method includes applying a source voltage (charging) or ground voltage (discharging) to a specific group of bit lines, testing the bit lines in two testing stages (open-circuit testing and short-circuit testing) by the principle that no damaged bit line can be charged or discharged, and acquiring an address data of a damaged bit line according to a status data stored in a page buffering circuit and related to whether a bit line is damaged, thereby dispensing with a calculation process for estimating the address of the damaged bit line.

3 Claims, 5 Drawing Sheets

METHOD OF IDENTIFYING DAMAGED BITLINE ADDRESS IN NON-VOLATILE

FIELD OF TECHNOLOGY

The present invention relates to memory address reading methods, and more particularly, to a method of identifying a damaged bitline address in a non-volatile memory device.

BACKGROUND

In case a defect in semiconductor process technology, severing and short circuits may occur to bit lines of a non-volatile memory device during a manufacturing process. For instance, due to the ever-decreasing dimensions of non-volatile memory devices, adjacent bit lines are becoming closer to each other. As a result, it is likely that during a manufacturing process a short circuit occurs because a bit line contact window is overly close to an adjacent bit line.

Hence, it is necessary to perform a testing process on a non-volatile memory device during a manufacturing process thereof not only to ensure that charges are appropriately injected into a memory cell by a programmed operation performed thereon, but also to determine whether the non-volatile memory device is defective. To this end, the prior art requires that the testing process work in conjunction with a computation process for configuring the address of a defective memory cell in order to enable subsequent configuration of a redundant memory cell. The computation process is disadvantageously time-consuming.

SUMMARY

It is an objective of the present invention to provide a method of identifying quickly a damaged bitline address in a non-volatile memory device.

Another objective of the present invention is to speed up bitline examination.

In order to achieve the above and other objectives, the present invention provides a method of identifying quickly a damaged bitline address in a non-volatile memory device. The non-volatile memory device comprises a memory cell array and a plurality of bit lines crossing the memory cell array. The bit lines have a first end and a second end each and are divided into a first group and a second group. The method comprises the steps of: S100: resetting a page buffering circuit; S200: performing a bitline damage test so as to store in the page buffering circuit a status data as to whether a bit line is damaged; S300: reading the bit lines in the page buffering circuit in sequence according to a sequence of the addresses of the bit lines of each memory cell and identifying the status data as to whether any one of the bit lines is damaged; and S400: latching a corresponding address when the status data indicate a logical level of a damaged status and treating the latched address as the address of the damaged bit line.

In an embodiment, the step S200 further comprises the sub-steps of: applying a supply voltage to the first-group bit lines via the first end thereof so as to perform a charge process and applying a ground voltage to the second-group bit lines; terminating the charge process of the first-group bit lines and applying a ground voltage to the first-group bit lines via the second end thereof so as to perform a discharge process; evaluating the status of each bit line of the first group according to the voltage level thereof, wherein it will be determined that a bit line has developed an open circuit and thereby has got damaged if the voltage level of the bit line is not a ground voltage; applying a supply voltage to the second-group bit lines via the second end thereof so as to perform the charge process, and applying a ground voltage to the first-group bit lines via the first end thereof so as to perform the discharge process; terminating the discharge process of the first-group bit lines; and evaluating the status of each bit line of the first group according to the voltage level thereof, wherein it will be determined that a bit line has developed a short circuit together with an adjacent bit line and thereby has got damaged if the voltage level of the bit line is not a ground voltage, wherein the first end of the bit lines receives a voltage from the page buffering circuit of the non-volatile memory device, and a data about whether open-circuit damage occurs to the bit line is stored in the page buffering circuit.

In an embodiment, odd-numbered bit lines are regarded as the first-group bit lines and even-numbered bit lines as the second-group bit lines, or the odd-numbered bit lines are regarded as the second-group bit lines and the even-numbered bit lines as the first-group bit lines.

In an embodiment, step S200 further comprises replacing the first-group bit lines with the second-group bit lines in the sub-steps during the process flow.

Accordingly, the present invention provides a method for storing in a page buffering circuit a status data about damaged bit line addresses, and acquiring an address data of a damaged bit line according to a status data stored in a page buffering circuit and related to whether a bit line is damaged, thereby dispensing with a calculation process for estimating the address of the damaged bit line.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

Figure 1:
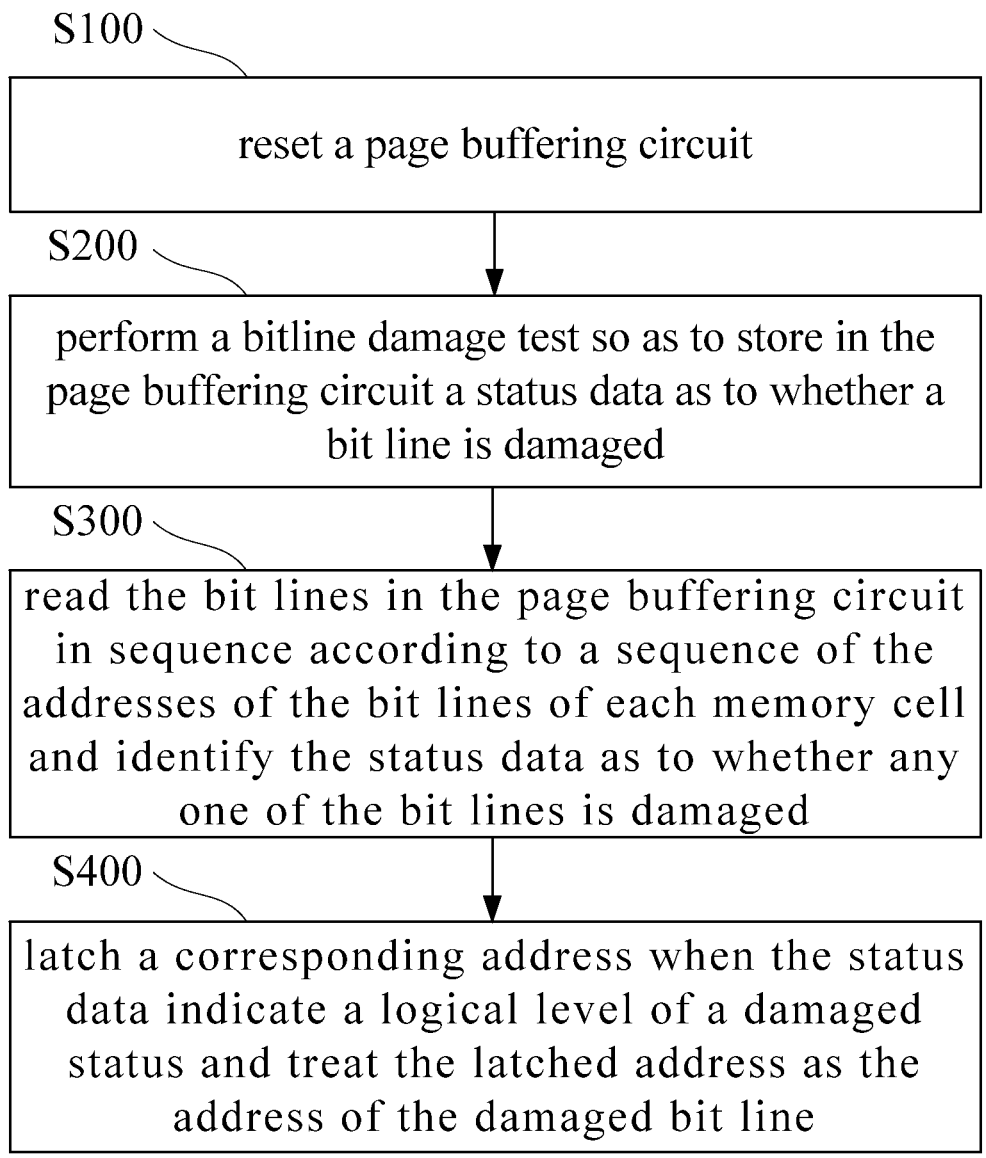
FIG. 1 is a flow chart of a method of identifying a damaged bitline address according to an embodiment of the present invention.

Referring to FIG. 1, there is shown a flow chart of a method of identifying a damaged bitline address according to an embodiment of the present invention. The method comprises the steps of: S100, resetting a page buffering circuit; S200, performing a bitline damage test so as to store in the page buffering circuit a status data as to whether a bit line is damaged; S300, reading the bit lines in the page buffering circuit in sequence according to a sequence of the addresses of the bit lines of each memory cell and identifying the status data as to whether any one of the bit lines is damaged; and S400, latching a corresponding address when the status data indicate a logical level of a damaged status and treating the latched address as the address of the damaged bit line.

Figure 2:
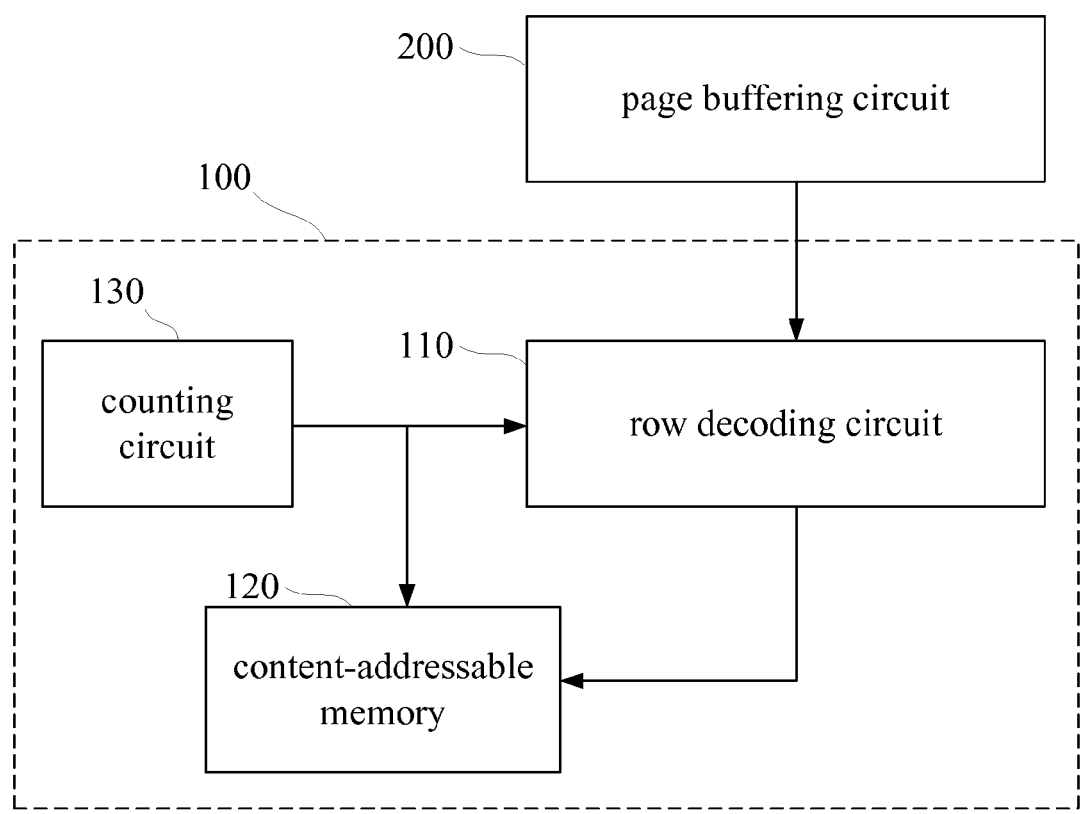
FIG. 2 is a block diagram of a portion of a circuit of identifying damaged bit line addresses according to an embodiment of the present invention.

Referring to FIG. 2, there is shown a block diagram of a portion of a circuit of identifying damaged bit line addresses according to an embodiment of the present invention. The circuit comprises a control circuit 100 and a page buffering circuit 200. The control circuit 100 comprises a row decoding circuit 110, a content-addressable memory (CAM) 120, and a counting circuit 130. The status data as to whether a bit line is damaged are stored in the page buffering circuit 200; hence, the step of reading the status data stored in the page buffering circuit 200 and adapted to indicate whether a corresponding bit line is damaged further involves reading data from the page buffering circuit 200, in a sequence according to the sequence of addresses of the bit lines of each memory cell as determined by the counting circuit 130, using the content-addressable memory (CAM) 120 under the control of the row decoding circuit 110, so as to obtain the data of each row of memory cells. Since unique addresses data are dedicated to an individual row of memory cells, the step of reading data from the page buffering circuit 200 comprises the sub-step of reading data from the page buffering circuit 200 with the control circuit 100 according to the address sequence determined by the counting circuit 130.

The content-addressable memory (CAM) 120 has a latch circuit for latching corresponding address data according to a logical level (such as a high logical level 1) indicating a damaged status, such that the address data can be transferred to the content-addressable memory (CAM) 120 by a subsequent programming process in order to obtain the address data indicating a damaged bit line. Hence, step S400 involves latching an address into the content-addressable memory 120 prior to the programming of the content-addressable memory 120, wherein the latched address has a logical level indicating a damaged status.

Figure 3:
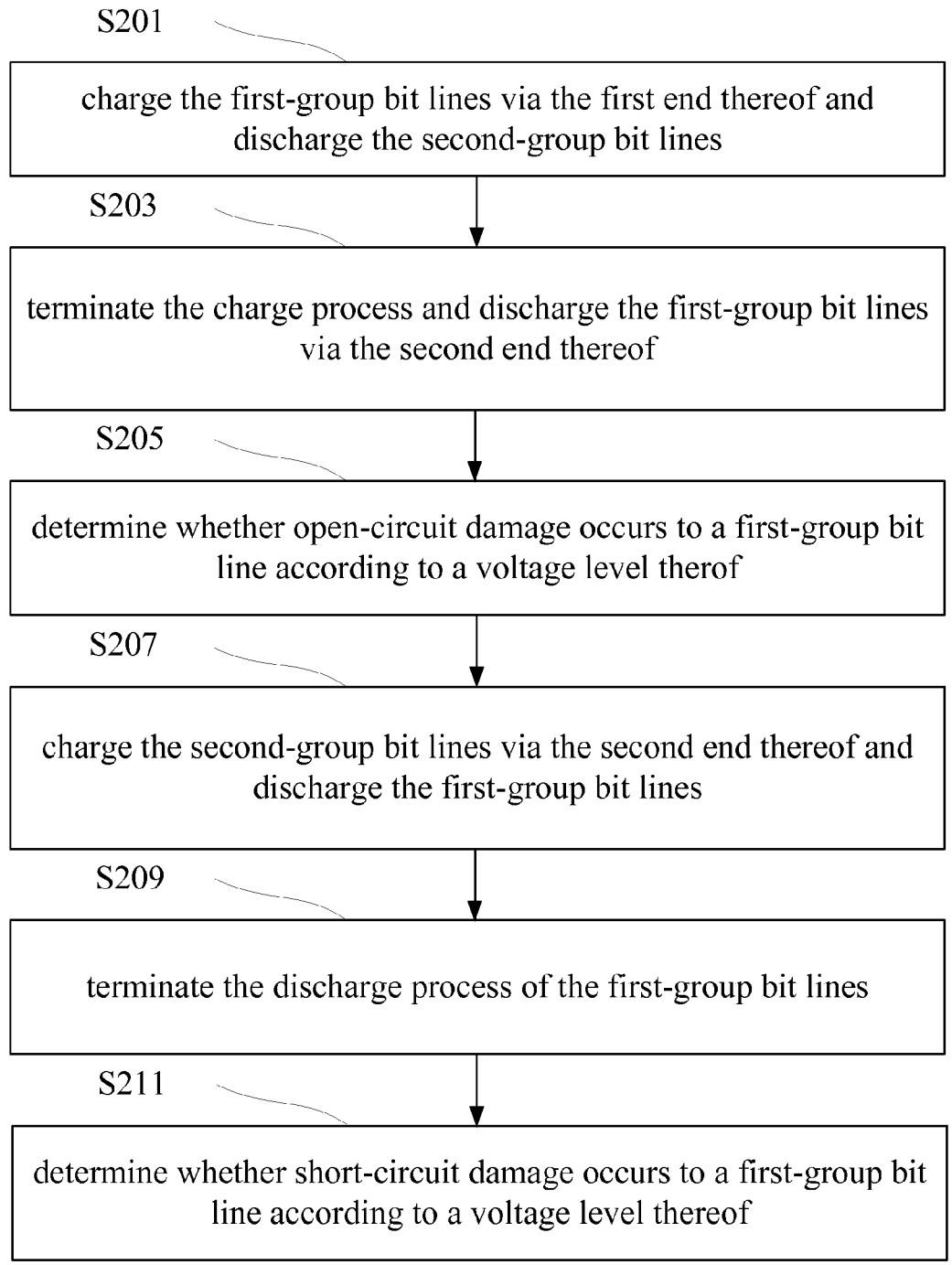
FIG. 3 is a flow chart of a method of detecting a damaged bit line in FIG. 1.

According to the present invention, addresses of damaged bit lines are read by a damaged bitline testing process carried in step S200. Referring to FIG. 3, there is shown a flow chart of a method of detecting a damaged bit line in FIG. 1. In an embodiment of the present invention, bit lines of a non-volatile memory device, which cross the memory cell array, are divided into two groups, namely a first group and a second group. Preferably, the bit lines of the non-volatile memory device are numbered, such that the odd-numbered bit lines belong to the first group, whereas the even-numbered bit lines belong to the second group. Alternatively, the odd-numbered bit lines belong to the second group, whereas the even-numbered bit lines belong to the first group. Each of the bit lines has two ends for inputting and outputting a signal. In an embodiment of the present invention, when it comes to a plurality of bit lines, the term "the first end" and the term "the second end" also serve to indicate a direction. For example, the expression "the first end of a plurality of bit lines" can be rephrased to "the bottom end of the memory cell array" (indicated by the letter B in FIG. 4). Similarly, the expression "the second end of the bit lines" can be rephrased to "the top end of the memory cell array" (indicated by the letter T in FIG. 4). The aforesaid rule applies to any embodiments described below.

After the bit lines have been numbered and grouped, a source voltage (for charging) or a ground voltage (for discharging) is applied to a specific group of the bit lines to thereby test and evaluate the bit lines by the principle that no damaged bit line can be charged or discharged.

Referring to FIG. 3, in an embodiment of the present invention, step S200 further comprises the sub-steps of:

First, sub-step S201: applying a supply voltage (such as Vcc) to the first-group bit lines via the first end (B) thereof so as to perform a charge process, and applying a ground voltage (such as Vss) to the second-group bit lines so as to provide shielding.

Then, sub-step S203: terminating the charge process of the first-group bit lines, and applying the ground voltage to the first-group bit lines via the second end (T) thereof so as to perform the discharge process, wherein the discharge process is performed on all the bit lines and will not stop unless and until all the bit lines are completely discharged. Those bit lines which have developed an open circuit (have severed) and thereby have got damaged are insusceptible to the discharge process and thus are readily identifiable.

Then, sub-step S205: evaluating the status of each bit line of the first group according to the voltage level thereof, wherein it will be determined that a bit line has developed an open circuit (has severed) and thereby has got damaged if the voltage level of the bit line is not a ground voltage (Vss) and that a bit line has not developed any open circuit (has not been severed) and thereby has not got damaged if the voltage level of the bit line is a ground voltage (Vss).

Then, sub-step S207: applying a supply voltage (Vcc) to the second-group bit lines via the second end (T) thereof so as to perform the charge process, and applying a ground voltage (Vss) to the first-group bit lines via the first end (B) thereof so as to perform the discharge process.

Upon completion of the charge process and the discharge process of sub-step S207, sub-step S209 begins. Sub-step S209 involves terminating the discharge process of the first-group bit lines. Sub-step S209 will last until the first-group bit lines which have developed an open circuit (have severed) and thereby have got damaged are fully charged by the adjacent second-group bit lines in the charge process. Those bit lines which have developed an open circuit and thereby have got damaged are charged in the continuous charge process and thus can be identified.

Then, sub-step S211: evaluating the status of each bit line of the first group according to the voltage level thereof, wherein it will be determined that a bit line has developed a short circuit together with an adjacent bit line and thereby has got damaged if the voltage level of the bit line is a source voltage (Vcc) and that a bit line has not developed a short circuit together with any adjacent bit line and thereby has not got damaged if the voltage level of the bit line is a ground voltage (Vss). The voltage level of a bit line of the first group will be a source voltage (Vcc), provided that the bit line develops a short circuit together with an adjacent bit line and is continuously charged when subjected to a charge process of the adjacent second-group bit lines shorting the affected bit line of the first group, and in consequence the voltage level of the affected bit line of the first group is not a ground voltage.

Sub-steps S201, S203, S205 belong to an open bitline test, whereas sub-steps S207, S209, S211 belong to a short bitline test.

Accordingly, the short-circuit status and the open-circuit status of the first-group bit lines can be detected and identified. Furthermore, to evaluate the second-group bit lines, it is necessary to replace the first-group bit lines with the second-group bit lines in the sub-steps during the process flow.

Figure 4:
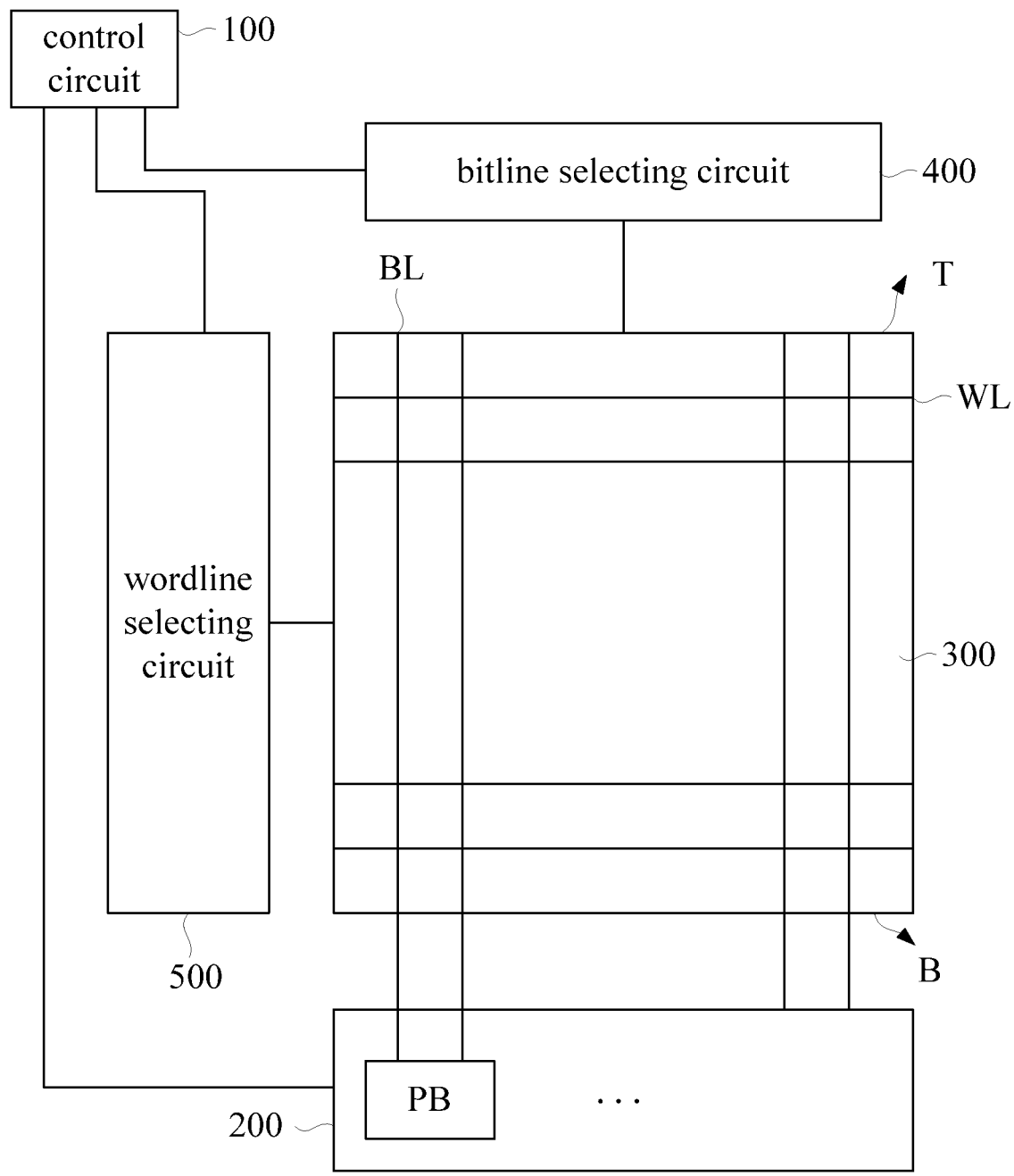
FIG. 4 is a block diagram of a non-volatile memory device according to an embodiment of the present invention.

Referring to FIG. 4, there is shown a block diagram of a non-volatile memory device according to an embodiment of the present invention. As shown in FIG. 4, the non-volatile memory device comprises a memory cell array 300, a page buffering circuit 200, a bitline selecting circuit 400, a wordline selecting circuit 500, and a control circuit 100 which are connected in a manner as shown. The control circuit 100 not only controls the page buffering circuit 200 and the bitline selecting circuit 400, but also determines whether to supply power to the memory cell array in order to perform the aforesaid testing process. The source voltage (Vcc) originates in an existing circuit of the memory cell array, and is supplied to a bit line group selected by the bitline selecting circuit 400. The control circuit 100 ensures that power supply will be available at the second end (top end, T) or the first end (bottom end, B) so as to apply a supply voltage to the bit lines.

Figure 5:
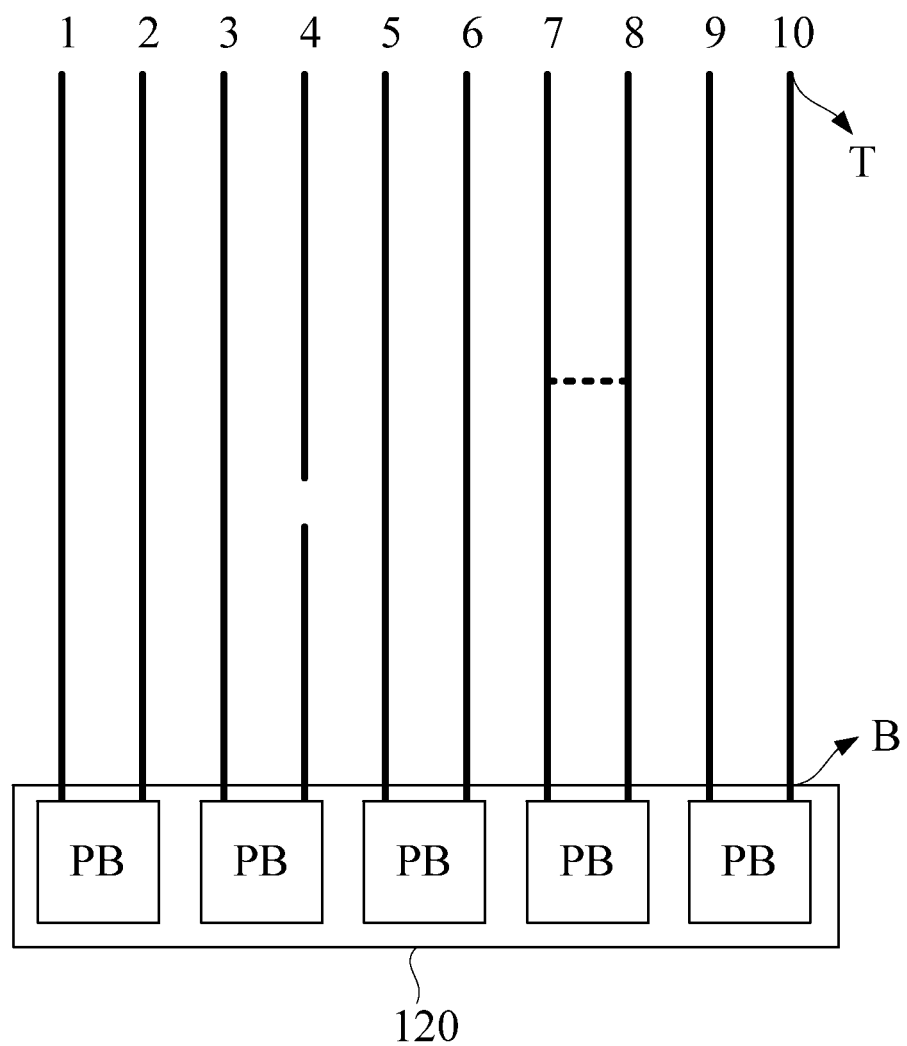
FIG. 5 is a schematic view of arrangement of bit lines according to an embodiment of the present invention.

Referring to FIG. 5, there is shown a schematic view of arrangement of bit lines according to an embodiment of the present invention. As shown in FIG. 5, to serve an exemplary purpose, 10 bit lines are provided, wherein each pair of bit lines is connected to a page buffer PB. The fourth bit line has an open circuit and thus is damaged. The seventh and eighth bit lines have developed a short circuit therebetween and thus are damaged. In practice, each of the page buffers PB can be connected to one or more bit lines.

This embodiment is exemplified and illustrated by performing a test on the first-group bit lines. Even-numbered bit lines (the second, fourth, sixth, eighth, and tenth bit lines) are regarded as the first-group bit lines, whereas odd-numbered bit lines (the first, third, fifth, seventh, and ninth bit lines) are regarded as the second-group bit lines. The letter T indicates the second end. The letter B indicates the first end.

First, the first-group bit lines (the second, fourth, sixth, eighth, and tenth bit lines) are charged via the first end (B) thereof, whereas the second-group bit lines (the first, third, fifth, seventh, and ninth bit lines) are discharged via the first end (B) and/or the second end (T). At this point in time, although the first end (B) of the fourth bit line accumulate charges, the eighth bit line does not, because the charges escape from the seventh bit line.

Then, the process flow terminates the charge process of the first-group bit lines (the second, fourth, sixth, eighth, and tenth bit lines) and starts to discharge all the bit lines (that is, the firth through tenth bit lines) via the second end (T) thereof. At this point in time, with the discharge process being carrying out to the second end (T), charges accumulated at the first end (B) of the fourth bit line are unlikely to escape, whereas the eighth bit line remains devoid of any accumulated charges.

The voltage level of the fourth bit line is a source voltage Vcc, whereas the voltage level of the other first-group bit lines (i.e., the second, sixth, eighth and tenth bit lines) is a ground voltage Vss; as a result, the page buffer PB keeps this status. For example, the logical value of the page buffer PB connected to the fourth bit line is set to 1, whereas the logical value of the other page buffers PB is set to 0.

Then, the second-group bit lines (the first, third, fifth, seventh, and ninth bit lines) are charged via the second end (T) thereof, whereas the first-group bit lines (the second, fourth, sixth, eighth, and tenth bit lines) are discharged via the first end (B) thereof. At this point in time, the eighth bit line does not accumulate any charges, as charges always enter the seventh bit line and exit the first end (B).

Afterward, the discharge process of the first-group bit lines (the second, fourth, sixth, eighth, and tenth bit lines) is terminated. At this point in time, only the discharge process is terminated, and thus the second-group bit lines (the first, third, fifth, seventh, and ninth bit lines) are still being charged; hence, charges go from the seventh bit line to the eighth bit line, thereby allowing charges to be accumulated at the eighth bit line.

The voltage level of the eighth bit line is a source voltage Vcc, whereas the voltage level of the other first-group bit lines (i.e., the second, fourth, sixth, and tenth bit lines) is a ground voltage Vss; as a result, the page buffer PB keeps this status. For example, the logical value of the page buffer PB connected to the eighth bit line is set to 1, whereas the logical value of the other page buffers PB is set to 0, wherein the aforesaid rule does not apply to those page buffers PB whose logical values have already been set to 1. In doing so, the method of the present invention is effective in determining whether open-circuit damage or short-circuit damage has happened to the first-group bit lines, thereby dispensing with a conventional time-consuming programming/erasing process.

Accordingly, the present invention provides the aforesaid specific testing method whereby damaged bitline address latching is based on whether a page buffering circuit carries special information or not, such that address-relate data can be accessed quickly and correctly, and most importantly, automatically and directly, with human intervention, not to mention that the method of the present invention streamlines the operation of reading damaged bitline addresses.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A method of identifying a damaged bitline address in a non-volatile memory device, the non-volatile memory device comprising a memory cell array and a plurality of bit lines crossing the memory cell array, the bit lines having a first end and a second end each and being divided into a first group and a second group, the method comprising the steps of:

S100: resetting a page buffering circuit;

S200: performing a bitline damage test so as to store in the page buffering circuit a status data as to whether a bit line is damaged;

S300: reading the bit lines in the page buffering circuit in sequence according to a sequence of the addresses of the bit lines of each memory cell and identifying the status data as to whether any one of the bit lines is damaged; and S400: latching a corresponding address when the status data indicate a logical level of a damaged status and treating the latched address as the address of the damaged bit line;

wherein the step S200 further comprises the sub-steps of:

applying a supply voltage to the first-group bit lines via the first end thereof so as to perform a charge process and applying a ground voltage to the second-group bit lines;

terminating the charge process of the first-group bit lines and applying a ground voltage to the first-group bit lines via the second end thereof so as to perform a discharge process; and evaluating the status of each bit line of the first group according to the voltage level thereof, wherein it will be determined that a bit line has developed an open circuit and thereby has got damaged if the voltage level of the bit line is not a ground voltage applying a supply voltage to the second-group bit lines via the second end thereof so as to perform the charge process, and applying a ground voltage to the first-group bit lines via the first end thereof so as to perform the discharge process; terminating the discharge process of the first-group bit lines; and evaluating the status of each bit line of the first group according to the voltage level thereof, wherein it will be determined that a bit line has developed a short circuit together with an adjacent bit line and thereby has got damaged if the voltage level of the bit line is not a ground voltage, wherein the first end of the bit lines receives a voltage from the page buffering circuit of the non-volatile memory device, and a data about whether open-circuit damage occurs to the bit line is stored in the page buffering circuit.

2. The method of claim 1, wherein the step S400 further comprises the sub-step of latching an address of a logical level indicating a damaged status in a content-addressable memory prior to programming of the content-addressable memory.

3. The method of claim 1, wherein odd-numbered bit lines are regarded as the first-group bit lines and even-numbered bit lines as the second-group bit lines, or the odd-numbered bit lines are regarded as the second-group bit lines and the even-numbered bit lines as the first-group bit lines.

* * * * *

UNITED STATES PATENT AND TRADEMARK OFFICE
CERTIFICATE OF CORRECTION

PATENT NO. : 8,923,083 B2  
APPLICATION NO. : 13/592437  
DATED : December 30, 2014  
INVENTOR(S) : Takao Akaogi et al.

It is certified that error appears in the above-identified patent and that said Letters Patent is hereby corrected as shown below:

On the Title page, Item (54) and in the Specification, column 1, Title, After "METHOD OF IDENTIFYING DAMAGED BITLINE ADDRESS IN NON-VOLATILE" insert -- MEMORY DEVICE --

Signed and Sealed this
First Day of September, 2015

Michelle K. Lee
*Director of the United States Patent and Trademark Office*